(12) United States Patent
Guo et al.

(10) Patent No.: US 12,525,152 B2
(45) Date of Patent: Jan. 13, 2026

(54) BOX AND TILED DEVICE

(71) Applicants: BOE MLED Technology Co., Ltd., Beijing (CN); BOE TECHNOLOGY GROUP CO., LTD., Beijing (CN)

(72) Inventors: Shaofei Guo, Beijing (CN); Shipeng Wang, Beijing (CN); Chao Tian, Beijing (CN); Yiping Ruan, Beijing (CN); Dongjia Hao, Beijing (CN)

(73) Assignees: BOE MLED Technology Co., Ltd., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/291,627

(22) PCT Filed: Aug. 19, 2022

(86) PCT No.: PCT/CN2022/113567
§ 371 (c)(1),
(2) Date: Jan. 24, 2024

(87) PCT Pub. No.: WO2024/036598
PCT Pub. Date: Feb. 22, 2024

(65) Prior Publication Data
US 2025/0087119 A1 Mar. 13, 2025

(51) Int. Cl.
G09F 9/30 (2006.01)
G09F 9/33 (2006.01)
H05K 7/20 (2006.01)

(52) U.S. Cl.
CPC .............. G09F 9/301 (2013.01); G09F 9/33 (2013.01); H05K 7/20963 (2013.01)

(58) Field of Classification Search
CPC .................................................. H05K 7/20963
See application file for complete search history.

(56) References Cited

U.S. PATENT DOCUMENTS 9,069,519 B1* 6/2015 Hall .................... H05K 7/20136
2012/0228241 A1* 9/2012 Akita .................... G09F 9/3026
211/26
(Continued)

FOREIGN PATENT DOCUMENTS

CN 201845518 U 5/2011
CN 104732889 A * 6/2015 .............. F24S 80/00
(Continued)

OTHER PUBLICATIONS

Xu et al., "Display screen capable of using solar energy to provide domestic hot water", 2015, CN104732889A, https://worldwide.espacenet.com/patent/search/family/053456745/publication/CN104732889A?q=pn%3DCN104732889A (Year: 2015).*
(Continued)

Primary Examiner — Tracie Y Green
Assistant Examiner — Michael Chiang
(74) Attorney, Agent, or Firm — HOUTTEMAN LAW LLC

(57) ABSTRACT

The embodiments of the present disclosure provide a box and a tiled device. The box is fitted for the tiled device. The box includes a bottom plate and a sidewall connected to the bottom plate, the sidewall being positioned on a side of the bottom plate and arranged along an edge of the bottom plate; a vent is provided in the bottom plate and/or the sidewall, and a corresponding retractable element is disposed at the vent; the retractable element includes a baffle configured to open or close the corresponding vent.

18 Claims, 5 Drawing Sheets

(56) References Cited

U.S. PATENT DOCUMENTS

| | | | | |
|---|---|---|---|---|
| 2021/0076115 | A1* | 3/2021 | Choi | H04R 1/028 |
| 2021/0231998 | A1* | 7/2021 | Noso | G02F 1/133385 |
| 2022/0024421 | A1* | 1/2022 | Lundy | B60S 1/56 |
| 2022/0180772 | A1* | 6/2022 | Inai | G09F 3/02 |
| 2022/0415217 | A1* | 12/2022 | Zhang | G09G 3/20 |

FOREIGN PATENT DOCUMENTS

| | | |
|---|---|---|
| CN | 111668733 A | 9/2020 |
| CN | 111724694 A | 9/2020 |
| CN | 112072519 U | 12/2020 |
| CN | 212064555 U | 12/2020 |
| CN | 112365798 A | 2/2021 |
| CN | 212724574 U | 3/2021 |
| CN | 213043944 U | 4/2021 |
| CN | 113114808 A | 7/2021 |
| CN | 113284322 A | 8/2021 |
| CN | 214256437 U | 9/2021 |
| CN | 114093248 A | 2/2022 |
| CN | 114399962 A | 4/2022 |
| CN | 216249799 U | 4/2022 |
| CN | 216930513 U | 7/2022 |
| CN | 217035073 U | 7/2022 |

OTHER PUBLICATIONS

China Patent Office, First Office Action dated Aug. 22, 2025, for corresponding CN application No. 202280002751.X.

* cited by examiner

BOX AND TILED DEVICE

CROSS-REFERENCE TO RELATED APPLICATION

This application is a National Phase Application filed under 35 U.S.C. 371 as a national stage of PCT/CN2022/113567, filed on Aug. 19, 2022, the contents of which are incorporated herein by reference in their entirety.

TECHNICAL FIELD

The present disclosure relates to the field of displaying, and in particular, to a box and a tiled device.

BACKGROUND

With the rapid development of display technology, the tiled device is more and more widely applied in large-scale places such as markets, cinemas, stadiums, which solves not only the technical problems of high cost and difficult maintenance of a single large-screen but also has high flexibility to be suitable for displaying images of various sizes.

The tiled device is formed by tiled a plurality of sub-display panel modules supported by a box.

SUMMARY

Embodiments of the disclosure provide a box and a tiled device.

In a first aspect, an embodiment of the present disclosure provides a box for a tiled device. The box includes a bottom plate and a sidewall connected to the bottom plate, the sidewall being located on one side of the bottom plate and arranged along an edge of the bottom plate;
  a vent is provided in the bottom plate and/or the sidewall, and a corresponding retractable element is disposed at the vent; and
  the retractable element includes a baffle configured to open or close the corresponding vent.

In some embodiments, the retractable element further includes:
  a first elastic component connected to the baffle and configured to generate elastic deformation and drive the baffle to move relative to the corresponding vent, so as to open or close the corresponding vent.

In some embodiments, the first elastic component is directly connected to the baffle, and the first elastic component is configured to drive the baffle to move linearly in a direction parallel to the vent in the case where the first elastic component is elastically deformed.

In some embodiments, the retractable element further includes:
  a guide rail connected to a corresponding baffle for the baffle to slide along.

In some embodiments, the number of the guide rail in the retractable element is two, two guide rails are located on two sides of the corresponding baffle and clamp the corresponding baffle, and the vent corresponding to the baffle is located between the two corresponding guide rails.

In some embodiments, the sidewall is formed with the vent, and the baffle corresponding to the vent on the sidewall is configured to be linearly movable in a first direction which is parallel to the corresponding vent and the bottom plate.

In some embodiments, the retractable element further includes: a connector; the first elastic component is connected to the baffle through the connector, and the connector is further rotatably connected to the box; and
  the first elastic component is configured to drive the connector and the baffle to rotate in the case where the first elastic component is elastically deformed.

In some embodiments, a first angle is provided between the connector and the baffle, the first angle being between 100° and 160°.

In some embodiments, the connector and the baffle are integrally formed.

In some embodiments, the first elastic component includes a first spring;
  the first spring is formed of a material including a shape memory alloy, and the first spring is configured to generate retraction deformation in accordance with temperature rise.

In some embodiments, a plurality of support posts are provided on the bottom plate, the support posts being configured to support a sub-display panel module.

In a second aspect, an embodiment of the present disclosure provides a tiled device, including: a plurality of boxes of the first aspect and a plurality of sub-display panel modules supported on the boxes;
  each of the sub-display panel module includes: a display panel and a bracket configured to bear the display panel.

In some embodiments, the display panel includes a light emitting panel and a flexible circuit board, the flexible circuit board being located on a back side of the light emitting panel and connected to the light emitting panel, and a drive structure is disposed on the flexible circuit board, the drive structure being located between the flexible circuit board and the light emitting panel; and
  the display panel further includes a heat dissipation structure which is located between the drive structure and the light emitting panel and configured to dissipate heat of the drive structure.

In some embodiments, the heat dissipation structure includes a first heat dissipation layer and a second heat dissipation layer, the first heat dissipation layer being located between the second heat dissipation layer and the drive structure, and
  the first heat dissipation layer is formed of a material including thermal conductive silicone grease, and the second heat dissipation layer is formed of a material including graphite.

In some embodiments, the display panel further includes a fixed heat conduction structure, which is configured to be fixed with the bracket; and
  a groove is disposed at a position of the fixed heat conduction structure corresponding to the heat dissipation structure, and the heat dissipation structure is located in the groove.

In some embodiments, the bracket includes: a first plate and a second plate which are arranged at an interval in a normal direction of the display panel, a first side edge of the first plate is connected to a first side edge of the second plate through a third plate, a second side edge of the first plate is connected to a second side edge of the second plate through a fourth plate, the first side edge and the second side edge are opposite sides, and the first plate, the second plate, the third plate and the fourth plate enclose a first ventilating passage; and
  an extension direction of the first ventilating passage is parallel to the plane where the display panel is located.

In some embodiments, a first cross section of the first plate has a shape of concave-convex;

the second plate has a first cross section of a square wave shape; and the first cross sections are cross sections perpendicular to the plane where the third plate is located and parallel to a normal of the display panel.

In some embodiments, the bracket further includes a sliding connection structure, which is located in and matched with the first ventilating passage, and the sliding connection structure is configured to move along the first ventilating passage and to extend out of or retract into the first ventilating passage; and the sliding connection structure encloses a second ventilating passage, an extension direction of the second ventilating passage being parallel to the extension direction of the first ventilating passage.

In some embodiments, the bracket further includes: at least one second elastic component, one end of the second elastic component being fixed inside the first ventilating passage, and the other end of the second elastic component being connected to the sliding connection structure; and the second elastic component is configured to generate elastic deformation and drive the sliding connection structure to move along the first ventilating passage.

In some embodiments, the second elastic component includes a second spring, which is formed of a material including a shape memory alloy, and the second spring generates elastic deformation in accordance with temperature rise.

In some embodiments, the sliding connection structure is formed of a material including a thermal conductive material.

BRIEF DESCRIPTION OF DRAWINGS

The accompanying drawings, which are included to provide further understanding of the present disclosure and constitute a part of this specification, serve to explain the present disclosure together with the following embodiments, but do not constitute a limitation of the present disclosure. In the drawings.

DETAIL DESCRIPTION OF EMBODIMENTS

Figure 1A:
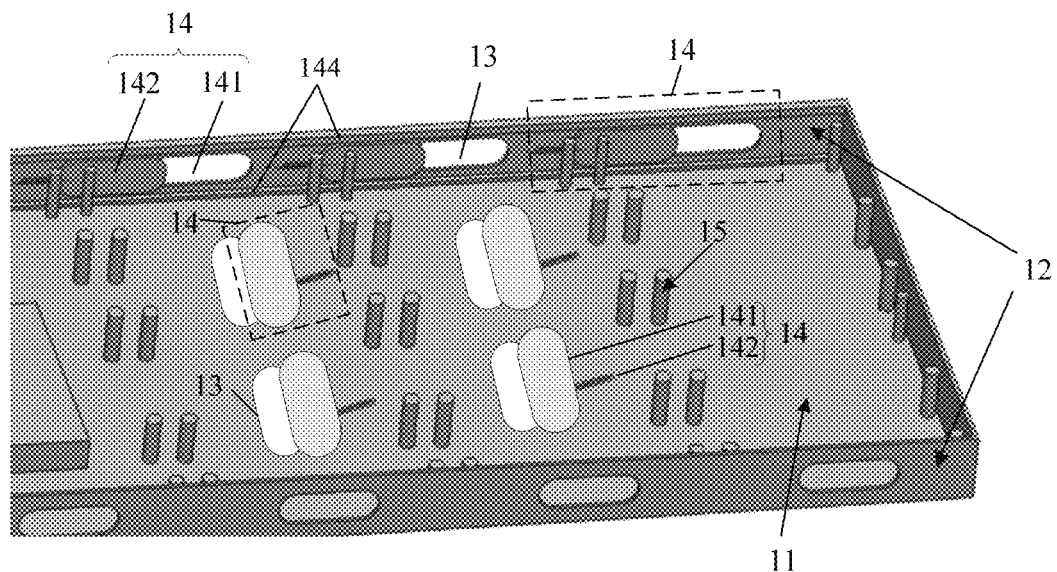
FIG. 1a is a schematic structural diagram of a box according to an embodiment of the present disclosure.

The embodiments of the present disclosure are described in further detail below with reference to the accompanying drawings. It should be understood that the embodiments described herein below are merely used to describe and explain the present disclosure only and are not intended to limit the present disclosure.

In order to more clearly illustrate the objects, technical schemes and advantages of the embodiments of the present disclosure, the technical schemes of the embodiments of the present disclosure will be described clearly and completely below with reference to the drawings of the embodiments of the present disclosure. It is to be understood that the described embodiments are not all but only a few embodiments of the present disclosure. All other embodiments, which can be derived by a person skilled in the art from the described embodiments of the present disclosure without inventive step, are within the scope of protection of the present disclosure.

Unless otherwise defined, the technical or scientific terms used in the embodiments of the present disclosure should have the ordinary meaning as understood by those of ordinary skill in the art to which the present disclosure belongs. The use of "first", "second" and the like in this disclosure is not intended to indicate any order, quantity, or importance, but rather is used to distinguish one component from another. Similarly, the term "including" or "comprising", and the like, means that the element or item preceding the word includes the element or item listed after the word and its equivalent, but does not exclude other elements or items. The terms "connected" or "coupled" and the like are not restricted to physical or mechanical connections, but may include electrical connections, whether direct or indirect. The terms "upper", "lower", "left", "right", and the like are used only to indicate relative positional relationships, and when the absolute position of the object being described is changed, the relative positional relationships may also be changed accordingly.

With the rapid development of display technology, the tiled device is more and more widely applied in places such as markets, cinemas, stadiums, which solves not only the technical problems of high cost and difficult maintenance of a single large-screen, but also has high flexibility to be suitable for displaying images of various sizes.

The tiled device as described above includes a plurality of sub-display panel modules and a box, where the box is configured to support the sub-display panel modules. Each of the sub-display panel modules includes a display panel and a bracket configured to bear the display panel. The display panel at least includes a light emitting panel and a drive structure, and the drive structure is configured to provide a driving signal for the light emitting panel so that a red/green/blue light-emitting device in the light emitting panel emits light under the drive of the driving signal.

In the display process of the light emitting panel, on one hand, since the drive structure mostly adopts a constant current drive mode and the current is in the μA level, the drive structure generates heat when the light emitting panel emits light, and especially when the light emitting panel displays a pure white image, the brightness of the light emitting panel is the highest, the driving current reaches the maximum value, and the amount of heat is increased accordingly; on the other hand, the tiled device includes a plurality of sub-display panel modules, i.e., includes a plurality of light emitting panels that are tiled together, however, since good air convection cannot be achieved in the tiled device, the heat dissipation effect of the light emitting panel is poor.

Further, in the case where the light emitting panel is in a display state and especially in the case where the pure white image is displayed, temperature inside the sub-display panel module is not uniformly distributed, which causes a large difference in the light emitting efficiency of the red/green/blue light emitting devices under the same driving current, resulting in an alternated cyan/white phenomenon on the pure white image, thereby affecting the display effect.

In order to solve at least one of the above technical problems, an embodiment of the present disclosure provides a box, which is applied to a tiled device and configured to support a plurality of sub-display panel modules.

Figure 1B:
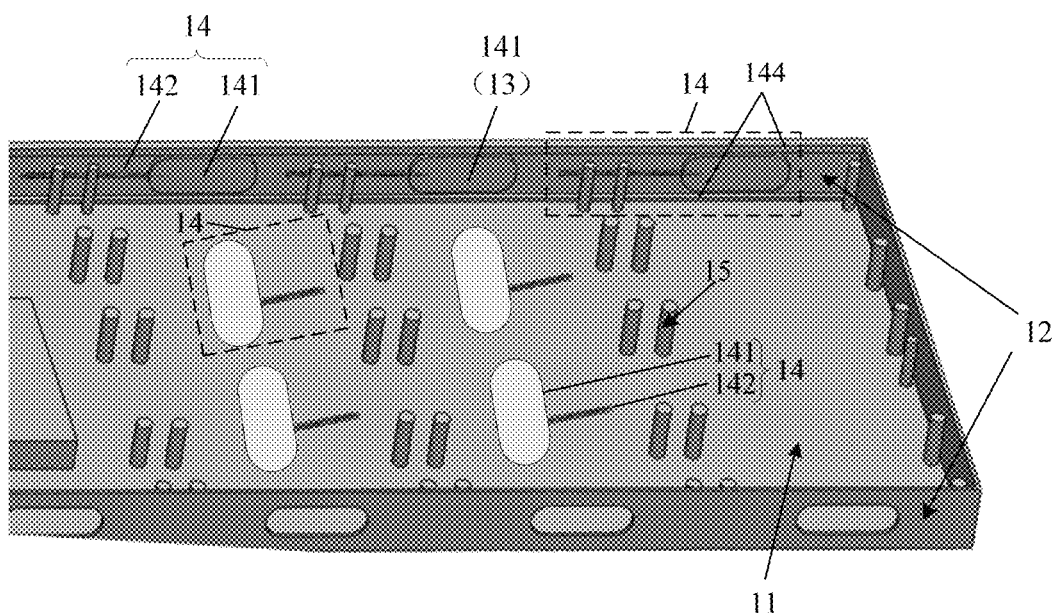
FIG. 1b is a schematic structural diagram of another box according to an embodiment of the present disclosure.

FIG. 1a is a schematic structural diagram of a box according to an embodiment of the present disclosure, and FIG. 1b is a schematic structural diagram of another box according to an embodiment of the present disclosure. As shown in FIGS. 1a and 1b, the box includes a bottom plate 11 and a sidewall 12 connected to the bottom plate 11, the sidewall 12 being located on one side of the bottom plate 11 and arranged along an edge of the bottom plate 11. A vent 13 is provided in the bottom plate 11 and/or the sidewall 12, and a retractable element 14 corresponding thereto is disposed at the vent 13; the retractable element 14 includes a baffle 141, the baffle 141 being configured to open or close a corresponding vent 13. The vent 13 is shown in an open state in FIG. 1a, and the vent 13 is shown in a closed state in FIG. 1b.

The box 1 according to the embodiment of the present disclosure, applied to a tiled device, includes a vent 13 provided in the bottom plate 11 and/or sidewall 12. In the case where the plurality of sub-display panel modules in the tiled device are in a display mode, the retractable element 14 opens the corresponding vent 13 to provide air circulation, so as to improve the uneven heat dissipation in the tiled device, and further prevent a large difference of light-emitting efficiency between different color light-emitting devices due to uneven temperature distribution, and improve the display effect of the tiled device.

In some embodiments, as shown in FIGS. 1a and 1b, a plurality of support posts 15 are disposed on the bottom plate 11, and the support posts 15 are configured to support the sub-display panel module. The support posts 15 have a certain height, and thus a certain distance is reserved between the sub-display panel module and the bottom plate 11. Based on this, the vents 13 provided in the bottom plate 11 and/or the sidewall 12 of the box 1 can achieve air circulation effect.

In some embodiments, the retractable element 14 further includes: a first elastic component 142, which is connected to the baffle 141 and is configured to generate elastic deformation to drive the baffle 141 to move relative to the corresponding vent 13, so as to open or close the corresponding vent 13, such that the heat of the plurality of sub-display panel modules supported by the box 1 can be effectively dissipated to improve the temperature uniformity in the tiled device.

In some embodiments, as shown in FIGS. 1a and 1b, the first elastic component 142 is directly connected to the baffle 141, and the first elastic component 142 is configured to drive the baffle 141 to move linearly along a direction parallel to the vent 13 in the case where the first elastic component 142 is elastically deformed, so as to open the corresponding vent 13.

Specifically, the retractable element 14 further includes: a guide rail 144 connected to the corresponding baffle 141 for the baffle 141 to slide along. The number of the guide rail 144 in the retractable element 14 is two, and two guide rails 144 are located on two sides of the corresponding baffle 141 and clamp the corresponding baffle 141, and the vent 13 corresponding to the baffle 141 is located between the two corresponding guide rails 144. The guide rails 144 define a sliding trajectory of the baffle 141 so that the corresponding vent 13 is opened or closed in accordance with the change in the sliding position of the baffle 141.

In some embodiments, the sidewall 12 is formed with a vent 13, and the baffle 141 corresponding to the vent 13 on the sidewall 12 is configured to be linearly movable along a first direction, which is parallel to the corresponding vent 13 and parallel to the bottom plate 11.

It should be noted that, that the baffle 141 being configured to move linearly along the first direction is realized by pulling the baffle 141 by the first elastic component 142 along the first direction parallel to the vent 13 to open the vent 13; or by pushing the baffle 141 by the first elastic component 142 in a direction, opposite to the first direction that is parallel to the vent 13, to open the vent 13, which is not limited in the embodiment of the present disclosure.

In addition, the baffle 141 that moves linearly along the first direction may also be the baffle 141 corresponding to the vent 13 on the bottom plate 11. In other words, no matter whether the vent 13 is disposed on the bottom plate 11 or the sidewall 12, the baffle 141 can be driven to move linearly along the first direction through elastic deformation of the first elastic component 142, so as to control the opening and closing of the vent 13.

Figure 2:
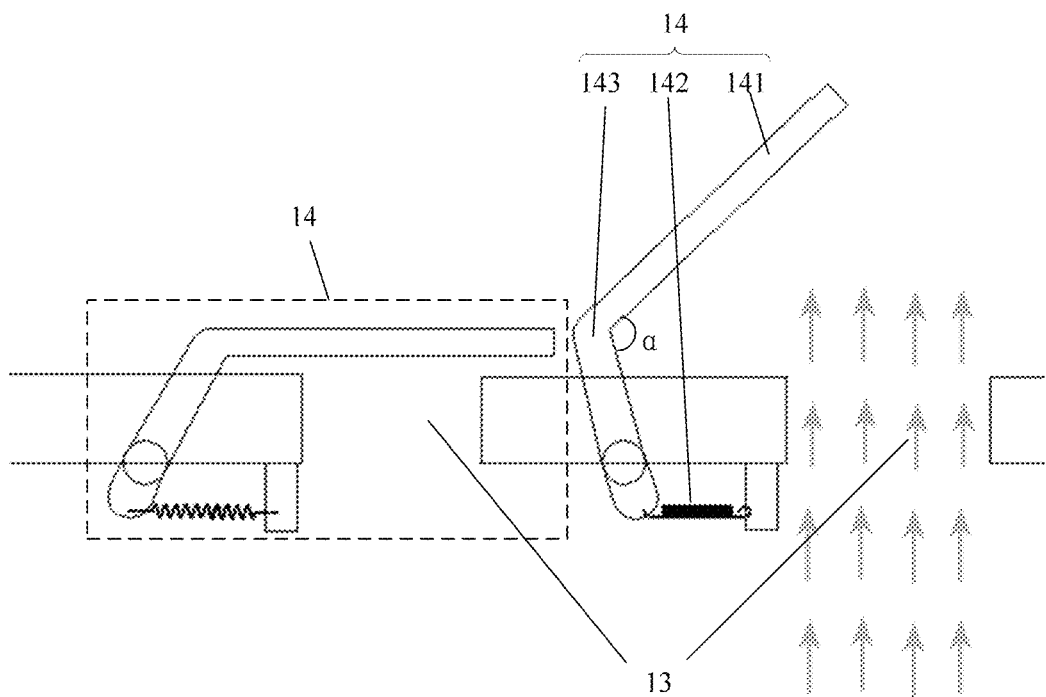
FIG. 2 is a schematic partial structural diagram of a box according to an embodiment of the present disclosure.

FIG. 2 is a schematic partial structural diagram of a box according to an embodiment of the present disclosure. In some embodiments, as shown in FIG. 2, the retractable element 14 further includes: a connector 143 which connects the first elastic component 142 to the baffle 141, and the connector 143 is further rotatably connected to the box 1; the first elastic component 142 is configured to drive the connector 143 and the baffle 141 to rotate in the case where the first elastic component 142 is elastically deformed, and during the rotation, the baffle 141 gradually moves away from or towards the box 1 to open or close the vent 13. A direction indicated by an arrow in FIG. 2 is a ventilation direction in the case where the vent is in an open state.

In some embodiments, a first angle $\alpha$ is included between the connector 143 and the baffle 141, the first angle $\alpha$ being ranged between 100° and 160°. In other words, an obtuse angle is formed between the connector 143 and the baffle 141. As such, in the case where the connector 143 rotates under the driving of the first elastic component 142, the baffle 141 can also be driven to rotate to open or close the vent 13.

It is to be understood that in an example, the connector 143 and the baffle 141 may be formed into an integral structure; in other examples, the connector 143 and the baffle 141 may also be two separate structures connected by a fastener, which is not limited in the embodiment of the present disclosure.

Figure 3A:
FIG. 3a is a schematic diagram of a first elastic component in a stretched state according to an embodiment of the present disclosure.
Figure 3B:
FIG. 3b is a schematic diagram of the first elastic component in a retracted state according to an embodiment of the present disclosure.

FIG. 3a is a schematic diagram of a first elastic component in a stretched state according to an embodiment of the present disclosure, and FIG. 3b is a schematic diagram of the first elastic component in a retracted state according to an embodiment of the present disclosure. In some embodiments, as shown in FIGS. 3a and 3b, the first elastic component 142 includes a first spring; the first spring is formed of a material including a shape memory alloy, and the first spring is configured to generate retraction deformation in accordance with temperature rise.

The shape memory alloy is a material having shape memory effect enabled by thermal elasticity, martensite phase transformation and inverse transformation thereof, and the material includes at least two metal materials. The shape memory alloy has two phases, i.e., a high temperature austenite phase and a low temperature martensite phase, and the shape memory alloy can be transformed from one crystal phase to another crystal phase by changing its temperature. In the process of crystal phase transformation, the volume of the shape memory alloy changes therewith.

Since the shape memory alloy material has shape memory characteristics, the shape memory alloy material is used in the embodiment of the present disclosure to form the first spring, which reflects the inverse transformation process of crystal phase in accordance with the temperature rise. As shown in FIG. 3b, as the temperature rises, the crystal phase of the material is transformed from martensite to austenite with the volume thereof shrunk. Specifically, the first spring generates retraction deformation as the temperature rises, and the baffle 141 moves under a pulling force generated by the deformation of the first spring to open the vent 13.

Based on this, in the box 1 according to the embodiment of the present disclosure, the crystal phase of the material inside the first elastic component 142, i.e. the first spring, is transformed as temperature changes. The first spring is elastically deformed when the temperature rises, and a pulling or pushing force relative to the baffle 141 is generated due to the elastic deformation of the first spring, so that the baffle 141 controls the opening and closing of a plurality of vents 13 in the bottom wall and/or the sidewall 12 of the box 1. Specifically, the baffle 141 can be driven by the first spring to move linearly in the direction parallel to the vent 13 and can also be rotatably connected to the box 1 via the connector 143. The connector 143 and the baffle 141 are driven by the first spring to rotate, so as to realize opening or closing of the vent 13. The scheme as described above can realize automatic temperature control adjustment in the box 1. The vent 13 is closed when the temperature is low, so that the tiled device is prevented from being corroded by water vapor and polluted by dust; the vent 13 is opened when the temperature is high, so that the phenomenon of uneven image on the sub-display panel modules supported by the box 1 is avoided to improve the display effect of the tiled device.

An embodiment of the present disclosure further provides a tiled device, including: a plurality of the boxes 1 as described above and a plurality of sub-display panel modules 2 supported by each box 1.

Figure 4:
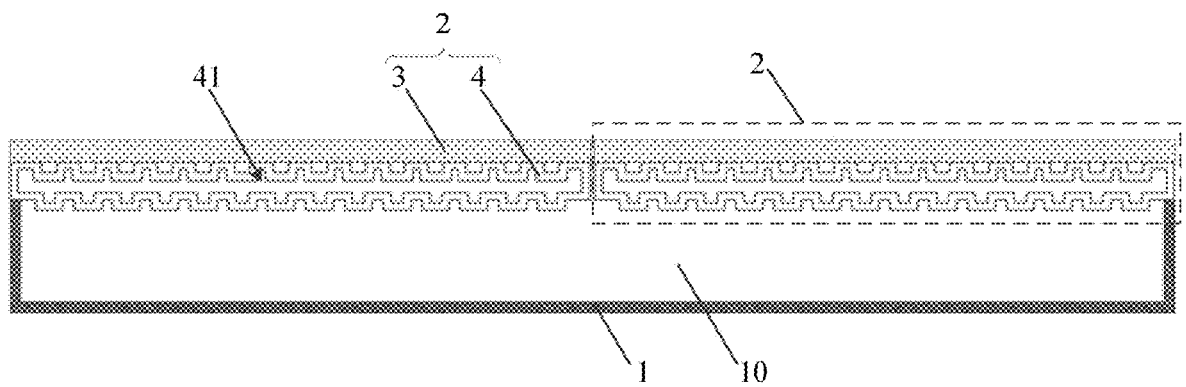
FIG. 4 is a schematic structural diagram of a tiled device according to an embodiment of the present disclosure.

FIG. 4 is a schematic structural diagram of a tiled device according to an embodiment of the present disclosure. As shown in FIG. 4, a plurality of sub-display panel modules 2 are supported by the box 1, each of the sub-display panel modules 2 includes a display panel 3 and a bracket 4, the bracket 4 being configured to support the display panel 3. In FIG. 4, a box ventilating passage 10 is formed between the bottom plate 11 of the box 1 and the sub-display panel module2, and a first ventilating passage 41 is defined inside the bracket 4. Air convection can be formed both in the box ventilating passage 10 and the first ventilating passage 41 to avoid an uneven image display phenomenon caused by the excessively high temperature of the display panel 3.

Figure 5:
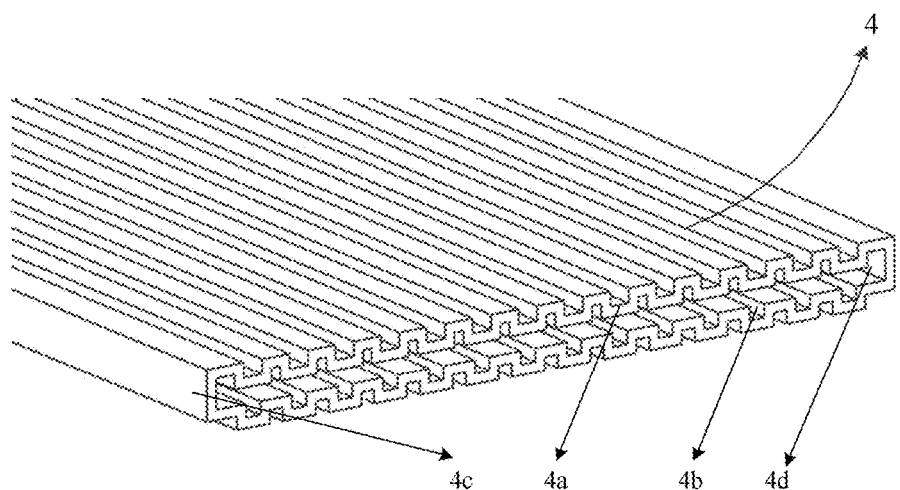
FIG. 5 is a schematic structural diagram of a bracket according to an embodiment of the present disclosure.

FIG. 5 is a schematic structural diagram of a bracket according to an embodiment of the present disclosure. As shown in FIG. 5, the bracket 4 includes: a first plate 4a and a second plate 4b arranged at an interval in a normal direction of the display panel 3, a first side edge of the first plate 4a and a first side edge of the second plate 4b are connected through a third plate 4c, a second side edge of the first plate 4a and a second side edge of the second plate 4b are connected through a fourth plate 4d, the first side edge and the second side edge are opposite sides, and the first plate 4a, the second plate 4b, the third plate 4c and the fourth plate 4d enclose the first ventilating passage 41; an extension direction of the first ventilating passage 41 is parallel to the plane where the display panel 3 is located.

It should be understood that the extension direction of the first ventilating passage 41 being parallel to the plane where the display panel 3 is located refers to that the extension direction of the first ventilating passage 41 is substantially parallel to an extension direction of gate lines in the display panel 3, or is substantially parallel to an extension direction of data lines in the display panel 3. In particular, the extension direction of the first ventilating passage 41 may be flexibly set according to the current environment of the tiled device, which is not limited in the embodiment of the present disclosure.

In addition, since a plurality of sub-display panel modules 2 are supported by the box 1, and the plurality of sub-display panel modules 2 are arranged in an array, the plurality of brackets 4 are also arranged in an array. The extension direction of the first ventilating passage 41 enclosed inside the bracket 4 being parallel to the plane where the display panel 3 is located can also be understood as the extension direction of the first ventilating passage 41 being parallel to the extension direction of the box ventilating passage 10 formed in the box 1, or being intersected with the extension direction of the box ventilating passage 10. The box ventilating passage 10 is a ventilating passage formed by the vents 13 provided in opposite sidewalls 12 of the box 1, which is not limited in the embodiment of the present disclosure.

In some embodiments, as shown in FIG. 5, the first plate 4a has a first cross section of in a square wave shape; the second plate 4b has a first cross section in a square wave shape; the first cross sections are cross sections perpendicular to the plane where the third plate 4c is located and parallel to the normal of the display panel 3.

Figure 6A:
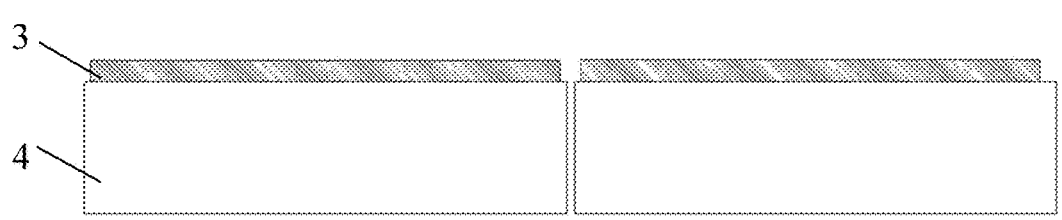
FIG. 6a is a schematic structural diagram of a plurality of sub-display panel modules in the related art.
Figure 6B:
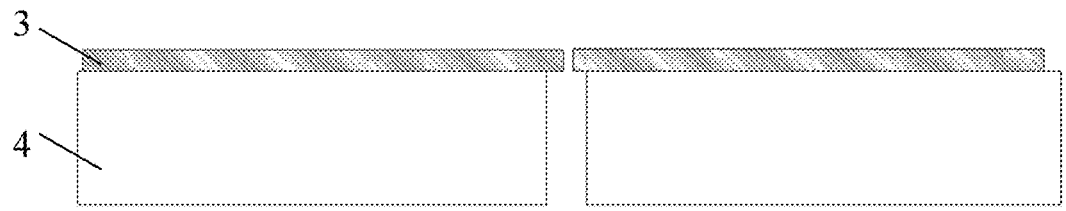
FIG. 6b is a schematic structural diagram of another plurality of sub-display panel modules in the related art.

FIG. 6a is a schematic structural diagram of a plurality of sub-display panel modules provided in the related art. FIG. 6b is a schematic structural diagram of another plurality of sub-display panel modules provided in the related art. In the process of assembling the plurality of sub-display panel modules, since there is no connector between adjacent sub-display panel modules, the display panel 3 shown in FIG. 6a is prone to a problem of contraction, so that a display blind seam occurs between adjacent display panels; alternatively, a problem of contraction of the bracket 4 as shown in FIG. 6b occurs, resulting in an unstable tiled device. Based on this, the bracket 4 according to the embodiment of the present disclosure further includes a sliding connection structure 43 to solve at least one of the above technical problems.

Figure 7A:
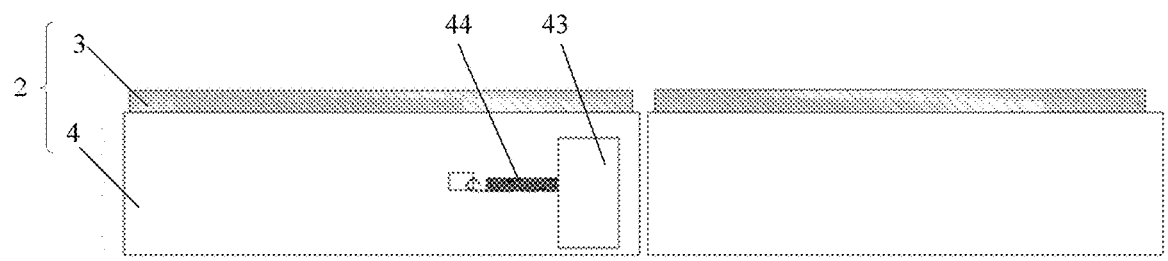
FIG. 7a is a schematic structural diagram of a plurality of sub-display panel modules according to an embodiment of the present disclosure.
Figure 7B:
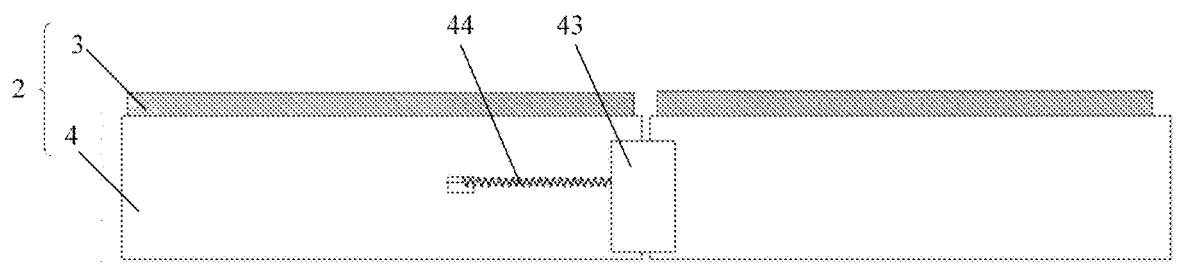
FIG. 7b is a schematic structural diagram of another plurality of sub-display panel modules according to an embodiment of the present disclosure.
Figure 8:
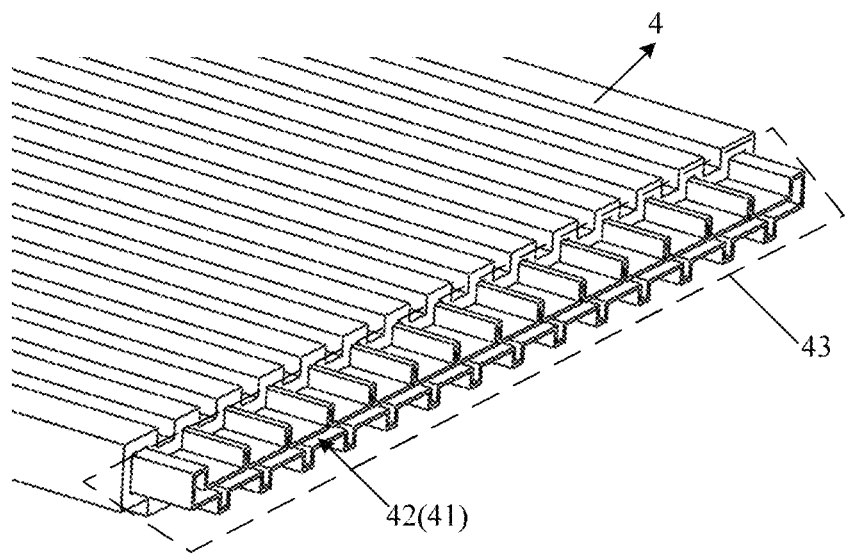
FIG. 8 is a schematic structural diagram of another bracket according to an embodiment of the present disclosure.

Optionally, FIG. 7a is a schematic structural diagram of a plurality of sub-display panel modules according to an embodiment of the present disclosure, FIG. 7b is a schematic structural diagram of another plurality of sub-display panel modules according to an embodiment of the present disclosure, and FIG. 8 is a schematic structural diagram of another bracket according to an embodiment of the present disclosure. In some embodiments, as shown in FIGS. 7a, 7b, and 8, the bracket 4 further includes a sliding connection structure 43. The sliding connection structure 43 is located in the first ventilating passage 41 and is matched with the first ventilating passage 41, and the sliding connection structure 43 is configured to move along the first ventilating passage 41 and extend out of or retract within the first ventilating passage 41. The sliding connection structure 43 is shown in a retracted state in FIG. 7a, and the sliding connection structure 43 is shown in an extended state in FIG. 7b; the sliding connection structure 43 defines a second ventilating passage 42, and the extension direction of the second ventilating passage 42 is parallel to the extension direction of the first ventilating passage 41.

As shown in FIGS. 7a, 7b, and 8, the sliding connection structure 43 can extend out of or retract within the first ventilating passage 41, and when the sliding connection structure 43 extends out, the extended portion enters the first ventilating passage 41 of an adjacent bracket 4. In other words, the sliding connection structure 43 can connect two adjacent brackets 4 in the extended state, so that the display blind seam between the display panels 3 supported by the two adjacent brackets 4 is eliminated to improve the display effect of the tiled device, and to ensure the stability of the plurality of sub-display panel modules 2 in the tiled device.

Meanwhile, the sliding connection structure 43 encloses a second ventilating passage 42. When the sliding connection structure 43 is in the extended state, two adjacent first ventilating passages 41 are connected via the second ventilating passage 42, and air convection among the plurality of sub-display panel modules 2 in the tiled device can be realized by means of chimney effect, so that the heat is exchanged and the temperature uniformity of the plurality of sub-display panel modules 2 in the tiled device can be improved.

In order to improve the heat dissipation efficiency of the sub-display panel modules 2 in the tiled device, the sliding connection structure 43 is formed of a material including a thermal conductive material, such as a metal and an alloy, which can not only provide sufficient rigidity to connect adjacent brackets but also exhibit good heat dissipation characteristics.

In some embodiments, as shown in FIGS. 7a and 7b, the bracket 4 further includes: at least one second elastic component 44, one end of the second elastic component 44 being fixed inside the first ventilating passage 41, and the other end of the second elastic component 44 being connected to the sliding connection structure 43; the second elastic component 44 is configured to generate elastic deformation and drive the sliding connection structure 43 to move along the first ventilating passage 41.

Optionally, the second elastic component 44 includes a second spring, the second spring is formed of a material including a shape memory alloy, and the second spring generates tensile deformation as the temperature rises. That is to say, the second spring exhibits a positive transformation of crystal phase in accordance with the temperature rise. In other words, as the temperature rises, the material transforms from austenite to martensite and expands in volume.

Based on this, in the tiled device according to the embodiment of the present disclosure, a second elastic component 44, i.e. a second spring, is disposed on the bracket 4, and the crystal phase of the internal material of the second spring is transformed in accordance with the temperature change, so that the second spring generates tensile deformation when the temperature rises, and the deformation generates a pushing force toward the sliding connection structure 43 so that the sliding connection structure 43 extends out. Therefore, the second spring pushes the sliding connection structure 4 when the temperature rises 3, so that the sliding connection structure 43 extends out to connect an adjacent bracket to form a continuous ventilating passage. In such way, the stability of the tiled device is ensured while the heat dissipation effect of the tiled device is improved.

In addition, the first elastic component 142 and the second elastic component 44 according to the embodiment of the present disclosure are both springs made of a shape memory alloy material, which can generate elastic deformation when the temperature rises, so as to drive other structures to move. That is, the first elastic component 142 and the second elastic component 44 are both driven by the heat energy generated in the tiled device without any other control device, so that the driving function can be realized while the power consumption is saved.

Figure 9:
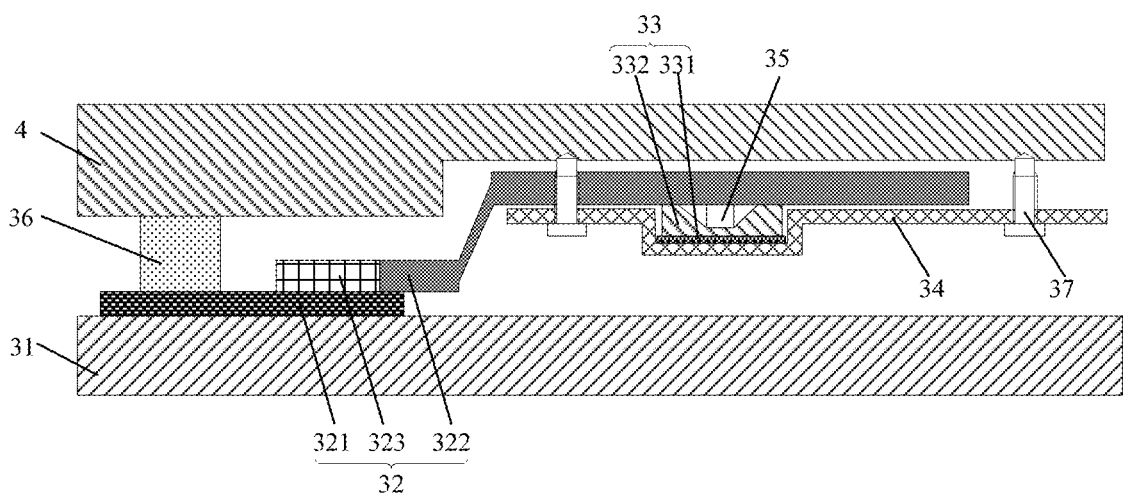
FIG. 9 is a schematic structural diagram of a display panel according to an embodiment of the present disclosure.

FIG. 9 is a schematic structural diagram of a display panel according to an embodiment of the present disclosure. In some embodiments, as shown in FIG. 9, the display panel 3 includes a light emitting panel 31, a flexible circuit board 32, a heat dissipation structure 33, and a drive structure 35.

The flexible circuit board 32 is located on a back side of the light emitting panel 31 and is connected to the light emitting panel 31, the drive structure 35 is disposed on the flexible circuit board 32, and the drive structure 35 is located between the flexible circuit board 32 and the light emitting panel 31. The heat dissipation structure 33 is located between the drive structure 35 and the light emitting panel 31, and the heat dissipation structure 33 is configured to dissipate heat of the drive structure 35. The back side of the light emitting panel 31 refers to a non-light-emitting side of the light emitting panel.

According to the tiled device according to the embodiment of the present disclosure, on one hand, air convection is realized by opening the vent 13 in the box 1; on the other hand, the heat dissipation structure 33 is disposed between the drive structure 35 and the light emitting panel 31 to dissipate heat of the drive structure 35, thereby improving the heat dissipation effect of the sub-display panel module2.

In an example, as shown in FIG. 9, the flexible circuit board 32 includes a first flexible circuit board 321 and a second flexible circuit board 322. The first flexible circuit board 321 is connected to the light emitting panel 31, the second flexible circuit board 322 is connected to the drive structure 35, the first flexible circuit board 321 is connected to the second flexible circuit board 322 via a connector 323, and the bracket 4 is connected to the first flexible circuit board 321 through an adhesive structure 36.

In some embodiments, as shown in FIG. 9, the heat dissipation structure 33 includes a first heat dissipation layer 331 and a second heat dissipation layer 332. The first heat dissipation layer 331 is located between the second heat dissipation layer 332 and the drive structure 35, the first heat dissipation layer 331 is formed of a material including thermal conductive silicone grease, and the second heat dissipation layer 332 is formed of a material including graphite. Since the first heat dissipation layer 331, i.e., the thermal conductive silicone grease, covers the drive structure 35, the second heat dissipation layer 332, i.e., the graphite, is located outside the first heat dissipation layer 331, and both the thermal conductive silicone grease and the graphite have good heat dissipation performance, the heat generated by the drive structure 35 can be quickly conducted out, thereby avoiding the phenomenon of local overheat of the display panel caused by high heat at the drive structure 35 and improving the heat dissipation efficiency of the tiled device.

In some embodiments, as shown in FIG. 9, the display panel 3 further includes a fixed heat conduction structure 34, the fixed heat conduction structure 34 being configured to be fixed to the bracket 4; a groove is disposed at a position of the fixed heat conduction structure 34 corresponding to the heat dissipation structure 33, and the heat dissipation structure 33 is located in the groove. Optionally, the fixed heat conduction structure 34 can be fixed to the bracket 4 via a screw 37. The fixed heat conduction structure 34 can be formed of a metal material, which also has a good heat dissipation performance and which can dissipate heat transferred from the drive structure 35 to the heat dissipation structure 33, thereby avoiding the phenomenon of uneven display image caused by the over high local temperature of the display panel 3.

It should be understood that the above embodiments are merely exemplary embodiments for the purpose of illustrating the principle of the disclosure, and the disclosure is not limited thereto. Various modifications and improvements can be made by a person having ordinary skill in the art without departing from the spirit and essence of the disclosure. Accordingly, all of the modifications and improvements also fall into the protection scope of the disclosure.

What is claimed is:

1. A box for a tiled device, comprising:
a bottom plate;
a sidewall, connected to the bottom plate,
wherein the sidewall is positioned on a side of the bottom plate and is arranged along an edge of the bottom plate;
a vent is provided in the bottom plate and/or the sidewall, and a corresponding retractable element is disposed at the vent; and
the retractable element includes a baffle configured to open or close the corresponding vent,
wherein the retractable element further comprises: a guide rail connected to a corresponding baffle for the baffle to slide along; and a first elastic component connected to the baffle and configured to generate elastic deformation and drive the baffle to move relative to the corresponding vent, so as to open or close the corresponding vent.

2. The box of claim 1, wherein the first elastic component is directly connected to the baffle, and the first elastic component is configured to drive the baffle to move linearly in a direction parallel to the vent in the case where the first elastic component is elastically deformed.

3. The box of claim 1, wherein the number of the guide rail in the retractable element is two, two guide rails are located on two sides of the corresponding baffle and clamp the corresponding baffle, and the vent corresponding to the baffle is located between the two corresponding guide rails.

4. The box of claim 3, wherein the sidewall is formed with the vent, and the baffle corresponding to the vent on the sidewall is configured to be linearly movable in a first direction which is parallel to the corresponding vent and the bottom plate.

5. The box of claim 1, wherein the retractable element further comprises: a connector;
the first elastic component is connected to the baffle through the connector, and the connector is further rotatably connected to the box;
the first elastic component is configured to drive the connector and the baffle to rotate in the case where the first elastic component is elastically deformed.

6. The box of claim 5, wherein a first angle is provided between the connector and the baffle, the first angle being ranged between 100° and 160°.

7. The box of claim 5, wherein the connector and the baffle are integrally formed.

8. The box of claim 1, wherein the first elastic component comprises a first spring;
the first spring is formed of a material including a shape memory alloy, and the first spring is configured to generate retraction deformation in accordance with temperature rise.

9. The box of claim 1, wherein a plurality of support posts are provided on the bottom plate, the support posts being configured to support a sub-display panel module.

10. A tiled device, comprising: a plurality of boxes of claim 1 and a plurality of sub-display panel modules supported by the boxes;
wherein each of the sub-display panel modules comprises:
a display panel and a bracket configured to bear the display panel.

11. The tiled device of claim 10, wherein the display panel comprises a light emitting panel and a flexible circuit board, the flexible circuit board being located on a back side of the light emitting panel and connected to the light emitting panel, and a drive structure is disposed on the flexible circuit board, the drive structure being located between the flexible circuit board and the light emitting panel; and
the display panel further includes a heat dissipation structure which is located between the drive structure and the light emitting panel and configured to dissipate heat of the drive structure.

12. The tiled device of claim 11, wherein the heat dissipation structure comprises a first heat dissipation layer and a second heat dissipation layer, the first heat dissipation layer being located between the second heat dissipation layer and the drive structure, and
the first heat dissipation layer is formed of a material including thermal conductive silicone grease, and the second heat dissipation layer is formed of a material including graphite.

13. The tiled device of claim 11, wherein the display panel further comprises a fixed heat conduction structure, which is configured to be fixed with the bracket; and
a groove is disposed at a position of the fixed heat conduction structure corresponding to the heat dissipation structure, and the heat dissipation structure is located in the groove.

14. The tiled device of claim 10, wherein the bracket comprises: a first plate and a second plate which are arranged at an interval in a normal direction of the display panel, wherein a first side edge of the first plate is connected to a first side edge of the second plate through a third plate, a second side edge of the first plate is connected to a second side edge of the second plate through a fourth plate, the first side edge and the second side edge being opposite sides, and the first plate, the second plate, the third plate and the fourth plate enclose a first ventilating passage; and
an extension direction of the first ventilating passage is parallel to the plane where the display panel is located.

15. The tiled device of claim 14, wherein the first plate has a first cross section of a square wave shape;
a first cross section of the second plate has a shape of concave-convex; and
the first cross sections are cross sections perpendicular to the plane where the third plate is located and parallel to a normal of the display panel.

16. The tiled device of claim 14, wherein the bracket further comprises a sliding connection structure;

wherein the sliding connection structure is located in and matched with the first ventilating passage, and the sliding connection structure is configured to move along the first ventilating passage and to extend out of or retract into the first ventilating passage; and the sliding connection structure encloses a second ventilating passage, an extension direction of the second ventilating passage being parallel to the extension direction of the first ventilating passage.

17. The tiled device of claim 16, wherein the bracket further comprises: at least one second elastic component, wherein one end of the second elastic component is fixed inside the first ventilating passage and the other end of the second elastic component is connected to the sliding connection structure; and the second elastic component is configured to generate elastic deformation and drive the sliding connection structure to move along the first ventilating passage.

18. The tiled device of claim 17, wherein the second elastic component comprises a second spring, which is formed of a material including a shape memory alloy and generates elastic deformation in accordance with temperature rise, and wherein the sliding connection structure is formed of a material including a thermal conductive material.

\* \* \* \* \*